(12) United States Patent
Radloff et al.

(10) Patent No.: US 12,080,668 B2
(45) Date of Patent: Sep. 3, 2024

(54) MULTI-LAYERED STRUCTURE INTERFACE BETWEEN A BALL GRID ARRAY DEVICE AND A PRINTED CIRCUIT BOARD

(71) Applicant: Dell Products L.P., Round Rock, TX (US)

(72) Inventors: Timothy Martin Radloff, Austin, TX (US); Geroncio Ong Tan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 354 days.

(21) Appl. No.: 17/656,729

(22) Filed: Mar. 28, 2022

(65) Prior Publication Data

US 2023/0307401 A1    Sep. 28, 2023

(51) Int. Cl.
   *H01L 23/00* (2006.01)
(52) U.S. Cl.
   CPC .... *H01L 24/16* (2013.01); *H01L 2224/10165* (2013.01); *H01L 2224/16227* (2013.01)
(58) Field of Classification Search
   CPC ............ H05K 2201/0314; H05K 1/00; H05K 3/4015; H01L 23/14; H01L 23/49531; H01L 23/49816; H01L 2224/16227; H01R 12/00
   See application file for complete search history.

(56) References Cited

U.S. PATENT DOCUMENTS

| | | | |
|---|---|---|---|
| 6,524,115 B1* | 2/2003 | Gates | G01R 1/06716 439/67 |
| 2004/0188123 A1* | 9/2004 | Peterson | H01L 24/11 257/E23.021 |
| 2010/0231251 A1* | 9/2010 | Nelson | G01R 1/0466 324/755.09 |

* cited by examiner

*Primary Examiner* — Victor A Mandala
*Assistant Examiner* — Lawrence C Tynes, Jr.
(74) *Attorney, Agent, or Firm* — McDermott Will & Emery LLP

(57) ABSTRACT

A multi-layered structure interface between a ball grid array (BGA) device and a printed circuit board (PCB), including a ball guide layer comprising a through hole; a first elastomeric portion of a first layer in superimposition with at least a portion of the through hole, the first elastomeric portion having a first width; and a second elastomeric portion of a second layer having a second width; wherein first elastomeric portion is positioned between the through hole of the ball guide layer and the second elastomeric portion, wherein the first width of the first elastomeric portion is greater than the second width of the second elastomeric portion.

10 Claims, 5 Drawing Sheets

MULTI-LAYERED STRUCTURE INTERFACE BETWEEN A BALL GRID ARRAY DEVICE AND A PRINTED CIRCUIT BOARD

BACKGROUND

Field of the Disclosure

The disclosure relates generally to an information handling system, and in particular, a multi-layered structure interface between a ball grid array device and a printed circuit board of the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a multi-layered structure interface between a ball grid array (BGA) device and a printed circuit board (PCB), including a ball guide layer comprising a through hole; a first elastomeric portion of a first layer in superimposition with at least a portion of the through hole, the first elastomeric portion having a first width; and a second elastomeric portion of a second layer having a second width; wherein first elastomeric portion is positioned between the through hole of the ball guide layer and the second elastomeric portion, wherein the first width of the first elastomeric portion is greater than the second width of the second elastomeric portion.

Other embodiments of these aspects include corresponding systems and apparatus.

These and other embodiments may each optionally include one or more of the following features. For instance, the first elastomeric portion and the second elastomeric portion are separate, independent portions. The first elastomeric portion and the second elastomeric portion are a single continuous body. The second layer further comprises a carrier portion surrounding the second elastomeric portion, and positioned between the PCB and the first elastomeric portion at a periphery of the first elastomeric portion. The first layer further comprises a carrier portion surrounding the first elastomeric portion, and positioned between the ball guide layer and the carrier portion of the second layer.

Particular implementations of the subject matter described in this specification can be implemented so as to realize one or more of the following advantages. For example, conduction between a particular solder ball joint and a respective contact pad of a printed circuit board is improved, while minimizing conduction (shorting) with adjacent pads of the printed circuit board (e.g., for a non-surface mount socket application).

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
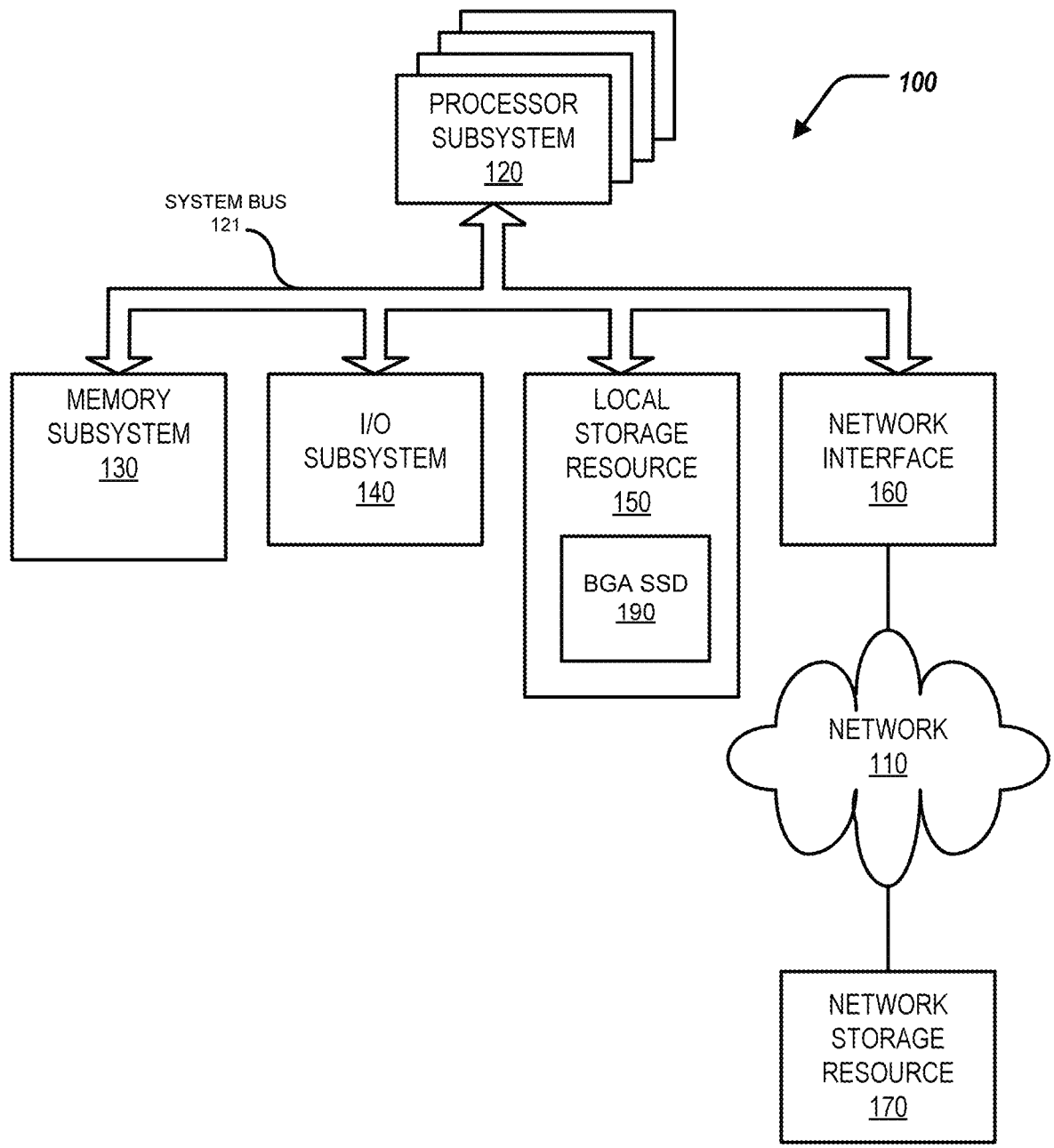
FIG. 1 is a block diagram of selected elements of an embodiment of an information handling system.

This disclosure discusses a multi-layered structure interface between a ball grid array device and a printed circuit board. Specifically, the ball grid array (BGA) device can be coupled to a printed circuit board (PCB) of an information handling system. The BGA device can include solder balls for establishing a connection between the BGA device and conductive pads of the PCB. Elastomeric portions of layers can be positioned between the solder balls and the conductive pads to facilitate such a connection. The elastomeric portions can form an elastomeric column (or structure). The elastomeric column (or structure) can include metal particles (e.g., silver or gold) such that when compressed, creates a conductive path to facilitate the connection. The elastomer column (or structure) can include a dual-width dual-layered layered design. A first elastomeric portion of a first layer can have a greater width for contact with the solder ball, with a second elastomeric portion of a second layer having a smaller width to minimize conduction with adjacent conductive pads of the PCB. A ball guide layer facilitates alignment between the solder balls with the elastomeric portions.

Specifically, this disclosure discusses a multi-layered structure interface between a ball grid array (BGA) solid-state drive (SSD) and a printed circuit board (PCB), a ball guide layer comprising a through hole; a first elastomeric portion of a first layer in superimposition with at least a portion of the through hole, the first elastomeric portion having a first width; and a second elastomeric portion of a second layer having a second width; wherein the first elastomeric portion is positioned between the through hole of the ball guide layer and the second elastomeric portion, wherein the first width of the first elastomeric portion is greater than the second width of the second elastomeric portion.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. The local storage resource 150 can include a ball grid array (BGA) solid-state drive (SSD) 190.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, a ball grid array (BGA) solid-state drive (SSD) (e.g., the BGA SSD 190) can be coupled to a printed circuit board (PCB) of the information handling system 100. The BGA SSD can include solder balls for establishing a connection between the BGA SSD and contact pads of the PCB. Elastomeric portions of a first layer and a second layer can be positioned between the solder balls and the contact pads to facilitate such a connection. The elastomer portions of the layers can include a dual-width dual-layered layered design. A first elastomeric portion of a first layer can have a greater width for contact with the solder ball, with a second elastomeric portion of a second layer having a smaller width to minimize conduction with adjacent contact pads of the PCB.

Figure 2:
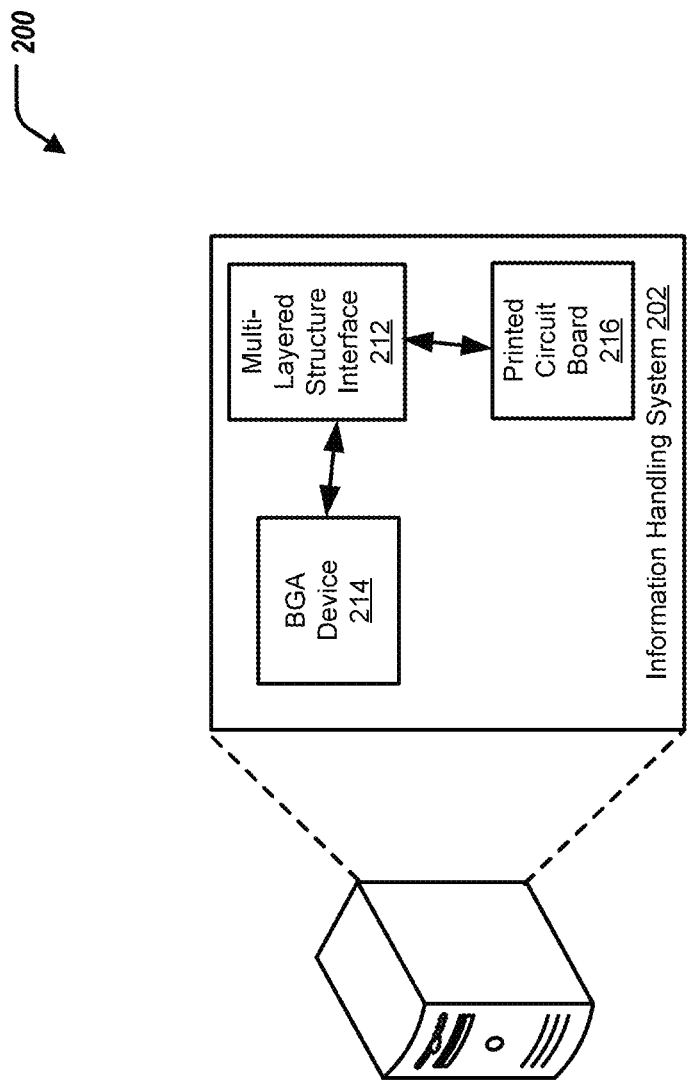
FIG. 2 illustrates a block diagram of an information handling system including a multi-layered structure interface between a ball grid array device and a printed circuit board.

Turning to FIG. 2, FIG. 2 illustrates an environment 200 including an information handling system 202. The information handling system 202 can include a multi-layered structural interface 212, a ball grid array (BGA) device 214, and a printed circuit board (PCB) 216. In some examples, the BGA device 214 can include a BGA solid-state drive (SSD) 214. In some examples, the information handling system 202 is similar to, or includes, the information handling system 100 of FIG. 1. In some examples, the BGA device 214 is the same, or substantially the same, as the BGA SSD 190 of FIG. 1.

Figure 3:
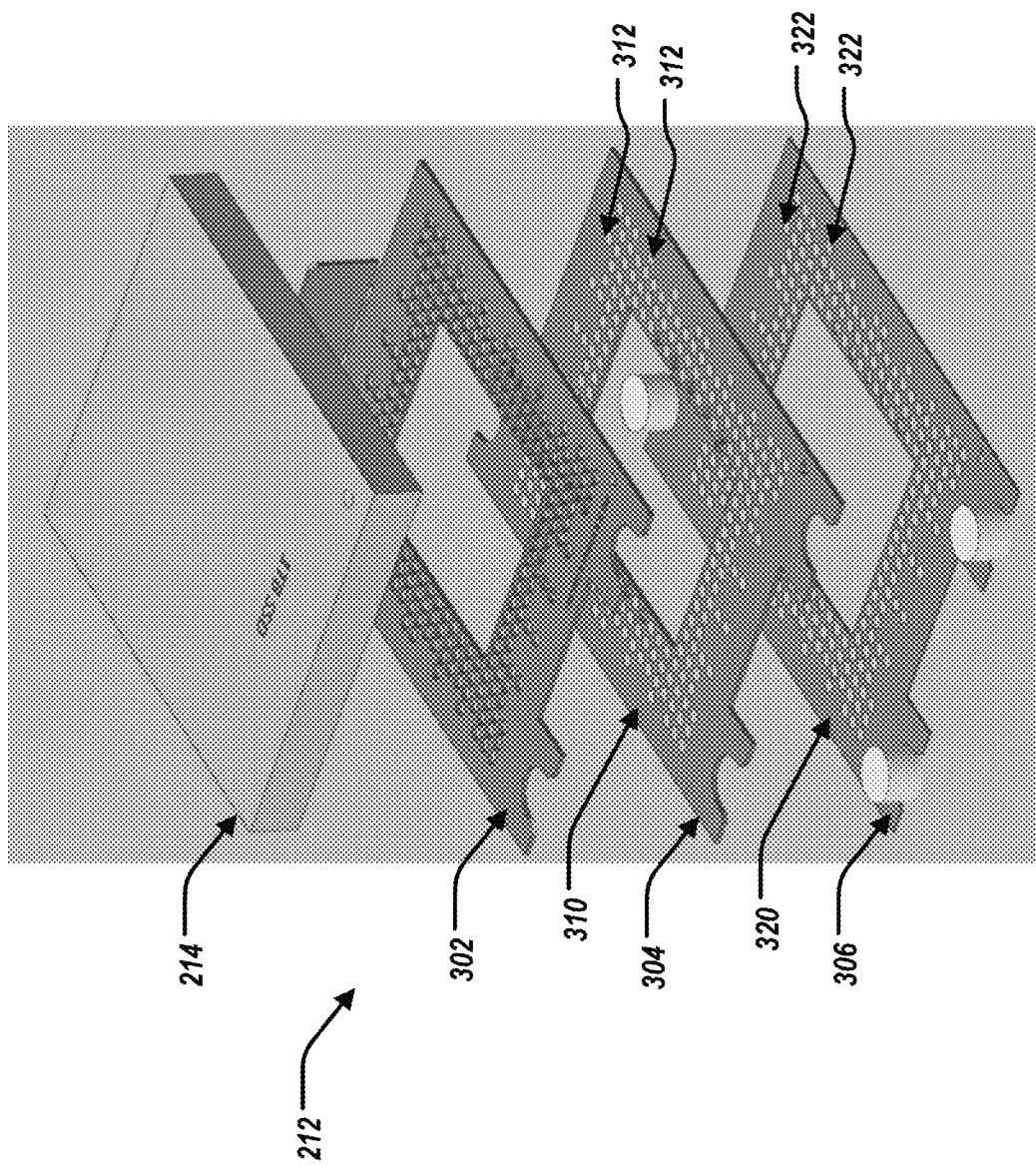
FIG. 3 illustrates an exploded view of the multi-layered structure interface.

FIG. 3 illustrates an exploded view of an example of the multi-layered structure interface 212. Specifically, the multi-layered structure interface 212 can include a ball guide layer 302, a first layer 304, and a second layer 306. The first layer 304 can include a carrier portion 310 with multiple first elastomeric portions 312. The second layer 306 can include a carrier portion 320 with multiple second elastomeric portions 322. The elastomeric portions 320, 322 of the layers 304, 306, respectively, can provide a connection between the BGA device 214 and the PCB 216, and in particular, between solder balls of the BGA device 214 and respective contacts on the PCB 216, described further herein.

Figure 4:
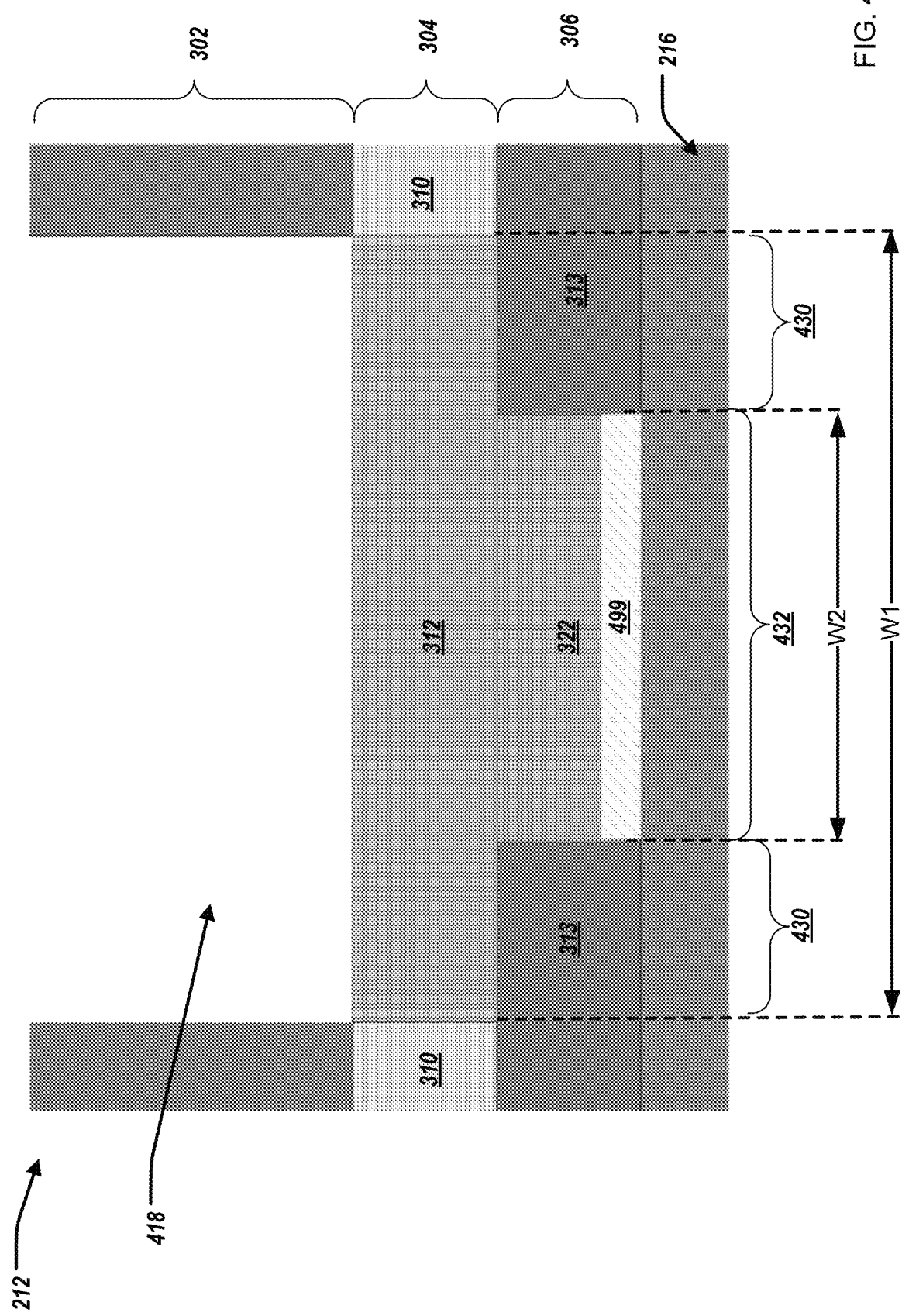
FIG. 4 illustrates a close-up cross-sectional view of a portion of the multi-layered structure interface independent of the ball grid array device.

FIG. 4 illustrates a close-up cross-sectional view of a portion of the multi-layered structure interface 212. Specifically, the multi-layered structure interface 212 can include the ball guide layer 302, the first layer 304, and the second layer 306, shown in FIG. 3. The first layer 304 can include the first elastomeric portion 312 surrounded by the carrier portion 310. The second layer 306 can include the second elastomeric portion 322 surrounded by the carrier portion 313. The carrier portions 310, 313 can be formed from non-compressible material. The elastomeric portions 312, 322 can be formed from compressible, conductive material. In some examples, ball guide layer 302, and carrier portions 310, 313 are formed from a polyimide material.

The PCB 216 can further include a copper pad layer 499.

The ball guide layer 302 can include a through hole 418. The through hole 418 can have any appropriate geometric shape, including polygonal, and rectangular. The first elastomeric portion 312 is in superimposition with at least a portion of the through hole 418 of the ball guide layer 302. The first elastomeric portion 312 can have a first width W1. The second elastomeric portion 322 can have a second width W2. The first width W1 of the first elastomeric portion 322 can be greater than the width W2 of the second elastomeric portion 322, defining a periphery (or perimeter) 430 of the first elastomeric portion 312 and a central portion 432 of the first elastomeric portion 312.

The first layer 304 can be positioned between the ball guide layer 302 and the second layer 306.

The first elastomeric portion 312 can be positioned between the through hole 418 of the ball guide layer 302 and the carrier portion 313 of the second layer 306 at the periphery 430 of the first elastomeric portion 312. Further, the first elastomeric portion 312 can be positioned between the through hole 418 of the ball guide layer 402 and the second elastomeric portion 322 of the second layer 304 at the central portion 432 of the first elastomeric portion 312. The second elastomeric portion 322 can be positioned between the first elastomeric portion 312 and the copper pad layer 499.

The carrier portion 310 of the first layer 304 can be positioned between the ball guide layer 302 and the carrier portion 313 of the second layer 306. Further, the carrier portion 310 of the first layer 304 can substantially surround the first elastomeric portion 312.

The carrier portion 313 of the second layer 306 can be positioned between the first elastomeric portion 310 and the PCB 216 at the periphery 430 of the first elastomeric portion 312; and further positioned between the carrier portion 310 of the second layer 306 and the PCB 216 outside of the periphery 430. The carrier portion 313 of the second layer 306 can substantially surround the second elastomeric portion 322.

The ball guide layer 302, the carrier portion 310, and the carrier portion 313 can be referred to as and function as a non-conductive compression stop structure.

The elastomeric portions 312 and 322 can be referred to as and function as a conductive elastomeric column/structure.

In some examples, the first elastomeric portion 312 and the second elastomeric portion 322 are separate, independent portions. When the first elastomeric portion 312 and the second elastomeric portion 322 are separate, independent portions, an interface is formed between the first elastomeric portion 312 and the second elastomeric portion 322.

In some examples, the first elastomeric portion 312 and the second elastomeric portion 322 are a single continuous (contiguous) body. When the first elastomeric portion 312 and the second elastomeric portion 322 are a single continuous (contiguous) body, the elastomeric portions 312, 322 are absent of (independent of) an interface therebetween.

The first elastomeric portion 312 and the second elastomeric portion 322 can form a "T"-based geometric shape, or a "mushroom"-based geometric shape.

Figure 5:
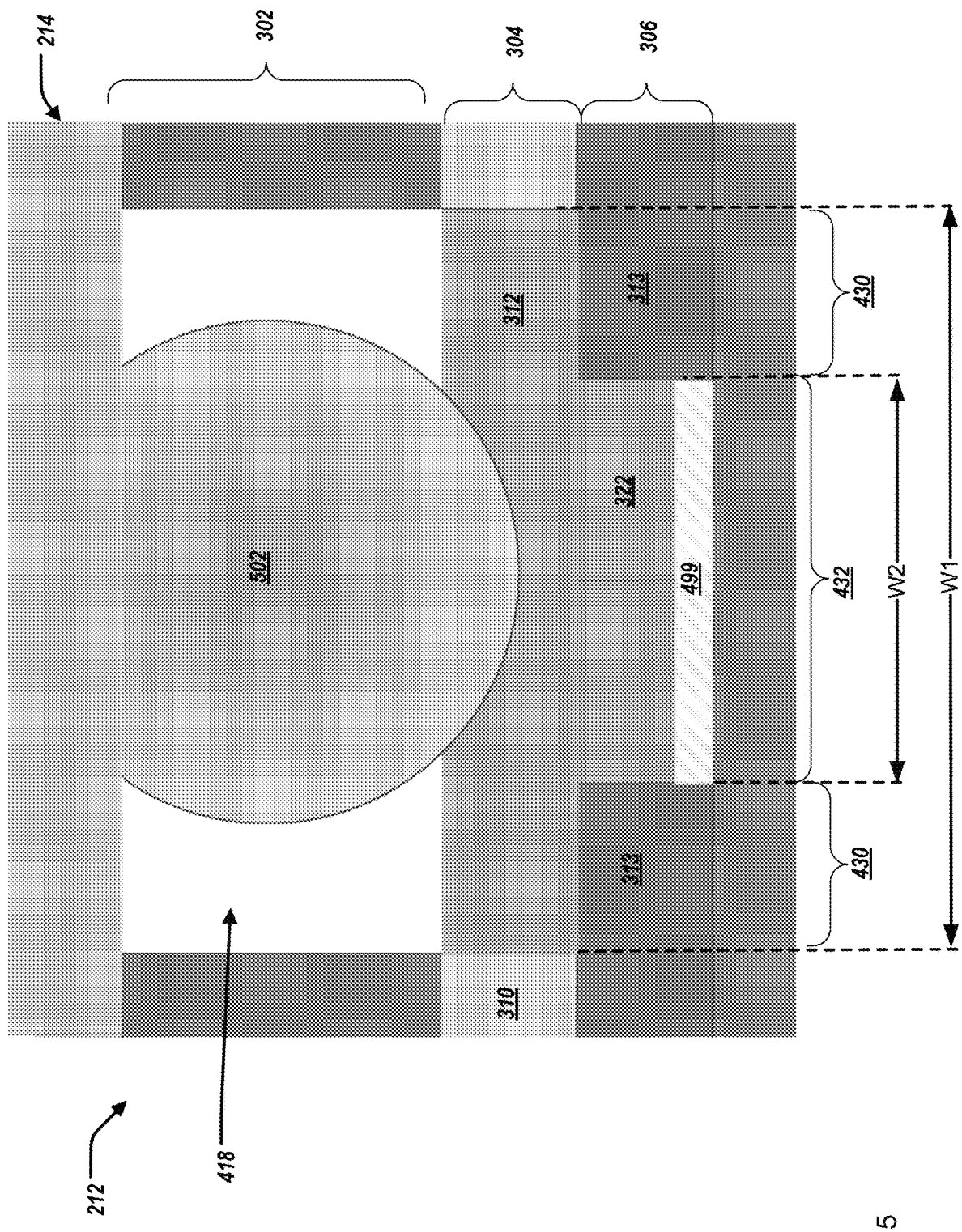
FIG. 5 illustrates a close-up cross-sectional view of a portion of the multi-layered structure interface, and the ball grid array device.

FIG. 5 illustrates a close-up cross-sectional view of a portion of the multi-layered structure interface 212, and the BGA device 214. In particular, a solder ball 502 of the BGA device 214 is positioned through (or within) the through hole 418 of the ball guide layer 302 and contacts the first elastomeric portion 312.

In some examples, the elastomeric portions 312, 322 can include a conductive material (e.g., metal particles such as silver or gold). When the solder ball 502 makes contact with the elastomeric portions 312, 322, a connection path is provided between the BGA device 214 through the solder ball 502 to the elastomeric portions 312, 322, and ultimately, the copper pad layer 499 the PCB 216 (e.g., a lane or path for conductivity). Specifically, the conductive material of the elastomeric portions 312, 322, when compressed, creates the connection path between the solder ball 502 and the copper pad layer 499. In some examples, the elastomeric portion 322 substantially surrounds the copper pad layer 499 of the PCB 216 when the solder ball 502 makes contact with the elastomeric portion 312.

To that end, the width W1 of the first elastomeric portion 312 is greater than the width W2 of the second elastomeric portion 322 to provide a greater placement tolerance for the BGA device 214 and the solder ball 502. Furthermore, the width W2 of the second elastomeric portion 322 is less than the width W1 of the first elastomeric portion 312 to minimize, reduce, and/or prevent conduction with adjacent solder pads of the PCB 216 and respective conductive pads of the PCB 216. In other words, the width W2 of the second elastomeric portion 322 is less than the width W1 of the first elastomeric portion 312 to minimize, reduce, and/or prevent shorting out adjacent conductive pads of the PCB 216.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A multi-layered structure interface between a ball grid array (BGA) device and a printed circuit board (PCB), comprising:
   a ball guide layer comprising a through hole;
   a first elastomeric portion of a first layer in superimposition with at least a portion of the through hole, the first elastomeric portion having a first width; and
   a second elastomeric portion of a second layer having a second width;
   wherein first elastomeric portion is positioned between the through hole of the ball guide layer and the second elastomeric portion,
   wherein the first width of the first elastomeric portion is greater than the second width of the second elastomeric portion.

2. The multi-layered structure interface of claim 1, wherein the first elastomeric portion and the second elastomeric portion are separate, independent portions.

3. The multi-layered structure interface of claim 1, wherein the first elastomeric portion and the second elastomeric portion are a single continuous body.

4. The multi-layered structure interface of claim 1, wherein the second layer further comprises a carrier portion surrounding the second elastomeric portion, and positioned between the PCB and the first elastomeric portion at a periphery of the first elastomeric portion.

5. The multi-layered structure interface of claim 1, wherein the first layer further comprises a carrier portion surrounding the first elastomeric portion, and positioned between the ball guide layer and the carrier portion of the second layer.

6. An information handling system, comprising:
a processor;
memory media storing instructions executable by the processor to perform operations;
a ball grid array (BGA) device including a solder ball;
a multi-layered structure interface positioned between the BGA device and a printed circuit board (PCB), the multi-layered structure interface including:
a ball guide layer comprising a through hole;
a first elastomeric portion of a first layer in superimposition with at least a portion of the through hole, the first elastomeric portion having a first width; and
a second elastomeric portion of a second layer having a second width,
wherein the first elastomeric portion is positioned between the through hole of the ball guide layer and the second elastomeric portion of the second layer,
wherein the first width of the first elastomeric portion is greater than the second width of the second elastomeric portion,
wherein the solder ball is positioned within the through hole and contacts the first elastomeric portion.

7. The information handling system of claim 6, wherein the first elastomeric portion and the second elastomeric portion are separate, independent portions.

8. The information handling system of claim 6, wherein the first elastomeric portion and the second elastomeric portion are a single continuous body.

9. The information handling system of claim 6, wherein the second layer further comprises a carrier portion surrounding the second elastomeric portion, and positioned between the PCB and the first elastomeric portion at a periphery of the first elastomeric portion.

10. The information handling system of claim 9, wherein the first layer further comprises a carrier portion surrounding the first elastomeric portion, and positioned between the ball guide layer and the carrier portion of the second layer.

* * * * *